US010394479B2

(12) United States Patent
Liang et al.

(10) Patent No.: US 10,394,479 B2
(45) Date of Patent: Aug. 27, 2019

(54) SOLID STATE STORAGE DEVICE WITH QUICK BOOT FROM NAND MEDIA

(71) Applicant: Micron Technology, Inc., Boise, ID (US)

(72) Inventors: Qing Liang, Shanghai (CN); Deping He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/749,402

(22) PCT Filed: Aug. 20, 2015

(86) PCT No.: PCT/CN2015/087616
§ 371 (c)(1),
(2) Date: Jan. 31, 2018

(87) PCT Pub. No.: WO2017/028296
PCT Pub. Date: Feb. 23, 2017

(65) Prior Publication Data
US 2018/0232169 A1 Aug. 16, 2018

(51) Int. Cl.
*G06F 3/06* (2006.01)
*G11C 29/52* (2006.01)
(Continued)

(52) U.S. Cl.
CPC .......... *G06F 3/0632* (2013.01); *G06F 3/0604* (2013.01); *G06F 3/0629* (2013.01);
(Continued)

(58) Field of Classification Search
CPC ...... G06F 3/0632; G06F 3/0629; G11C 29/52
See application file for complete search history.

(56) References Cited

U.S. PATENT DOCUMENTS 6,058,048 A * 5/2000 Kwon ............... G11C 16/20
365/185.33
6,252,800 B1 * 6/2001 Chida ............... G11C 29/44
365/185.11
(Continued)

FOREIGN PATENT DOCUMENTS

| CN | 101676872 A | 3/2010 |
| CN | 103140834 A | 6/2013 |
| JP | 2009087507 A | 4/2009 |

OTHER PUBLICATIONS

International Application No. PCT/CN2015/087616—International Search Report and Written Opinion, dated Apr. 1, 2016, 14 pages.
EP Patent Application No. 15901500.7—Extended European Search Report, dated Apr. 16, 2019, 7 pages.

*Primary Examiner* — Joseph D Torres
(74) *Attorney, Agent, or Firm* — Perkins Coie LLP

(57) ABSTRACT

Several embodiments of memory devices and related methods for initializing such memory devices based on initialization information on stored in NAND-based memory media. In one embodiment, a memory device can include a controller operably coupled to the memory media. The controller is configured to determine whether the initialization information stored at a region of the memory media is valid, initialize the memory device based at least in part on the initialization information when valid, and invalidate the initialization information stored at the region of the memory media by writing to the region of the memory media without first erasing the region of the memory media.

9 Claims, 4 Drawing Sheets

(51) Int. Cl.
*G06F 9/4401* (2018.01)
*G06F 11/10* (2006.01)

(52) U.S. Cl.
CPC .......... *G06F 3/0659* (2013.01); *G06F 3/0679* (2013.01); *G06F 9/4406* (2013.01); *G06F 11/1068* (2013.01); *G11C 29/52* (2013.01)

(56) References Cited

U.S. PATENT DOCUMENTS

| | | | | |
|---|---|---|---|---|
| 6,330,634 | B1* | 12/2001 | Fuse | G06F 11/1417 |
| | | | | 365/218 |
| 6,636,957 | B2* | 10/2003 | Stevens | G06F 13/4243 |
| | | | | 711/105 |
| 9,405,668 | B1* | 8/2016 | Fallone | G06F 9/4401 |
| 9,424,134 | B2* | 8/2016 | Gjorup | G06F 11/1417 |
| 2002/0176279 | A1* | 11/2002 | Kwon | G11C 5/143 |
| | | | | 365/185.18 |
| 2008/0239809 | A1* | 10/2008 | Chae | G11C 11/5621 |
| | | | | 365/185.09 |
| 2011/0060897 | A1* | 3/2011 | Toelkes | G06F 9/4418 |
| | | | | 713/2 |
| 2012/0036301 | A1 | 2/2012 | Caspole et al. | |
| 2012/0260027 | A1 | 10/2012 | Toelkes | |
| 2014/0157006 | A1 | 6/2014 | Kong et al. | |
| 2015/0074461 | A1* | 3/2015 | Yu | G06F 11/1417 |
| | | | | 714/36 |
| 2016/0092302 | A1* | 3/2016 | Agarwal | G06F 11/1068 |
| | | | | 714/773 |

* cited by examiner

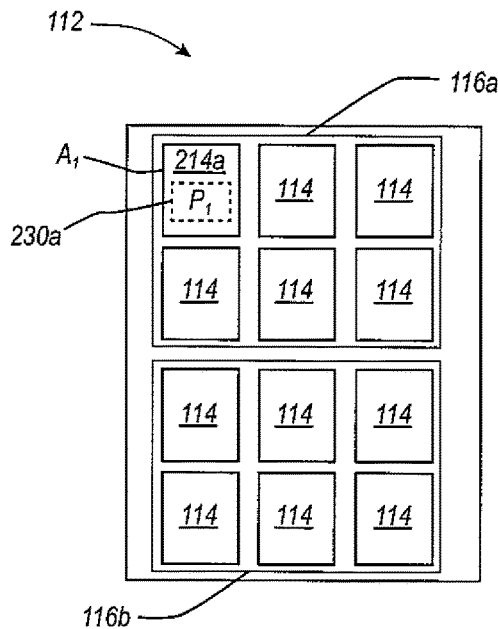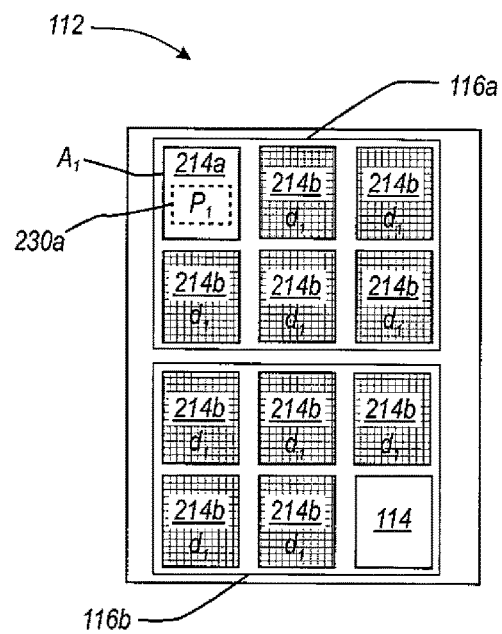
Fig. 2A  Fig. 2B
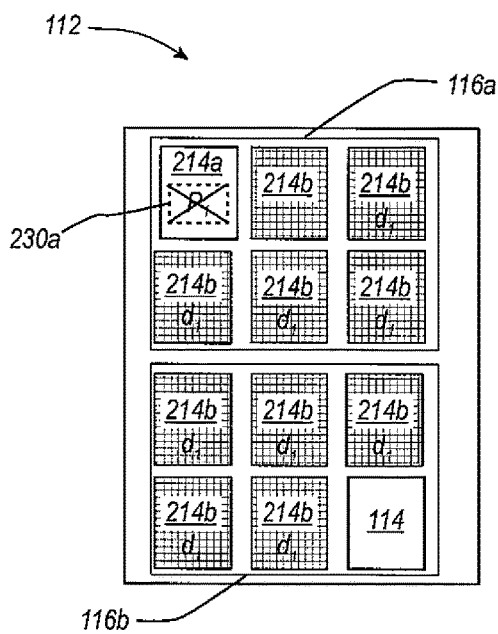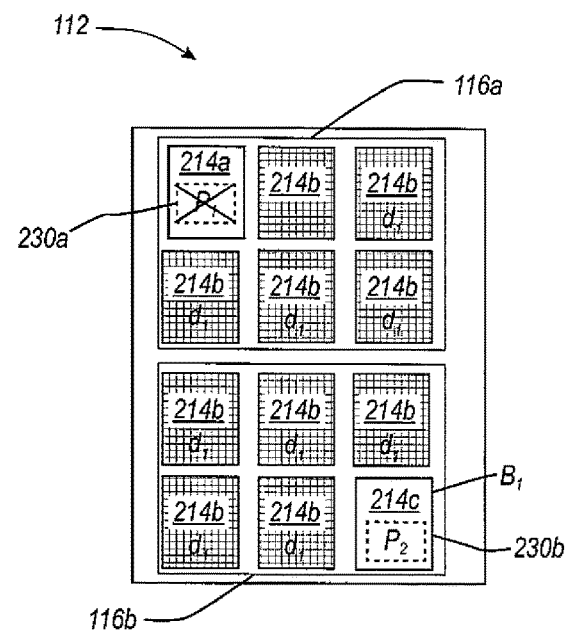
Fig. 2C  Fig. 2D

US 10,394,479 B2

SOLID STATE STORAGE DEVICE WITH QUICK BOOT FROM NAND MEDIA

TECHNICAL FIELD

The disclosed embodiments relate to memory devices and systems. In particular, the disclosed embodiments relate to methods for initializing solid state storage devices (SSDs) based on initialization information stored in NAND-based memory media.

BACKGROUND

SSDs use non-volatile, solid-state storage media, such as flash media, to persistently store large amounts of data. SSDs can operate in a manner similar to conventional hard disk drives (HDDs), but lack the motor, magnetic disc, read head, and other moving components of HDDs. The lack of moving parts makes SSDs more rugged than HDDs. For example, when an HDD is dropped or shaken, the read head can collide with and sometimes damage the rotating magnetic disc. Additionally, SSDs have faster read/write speeds than HDDs, and they make virtually no noise.

The flash media of an SSD can be "NOR flash" and/or a "NAND flash" media. NAND flash is typically favored for bulk data storage because it has a higher storage capacity, lower cost, and faster write speed than NOR flash. NAND flash, however, has a relatively complicated serial interface compared to a NOR flash interface, which can be a random access interface. As a result, NOR flash is often used in conjunction with NAND flash for storing certain programming information that is frequently reprogrammed. One such type of programming information is initialization information. The controller uses the initialization information at the time of startup (i.e., when the SSD is powered on).

BRIEF DESCRIPTION OF THE DRAWINGS

FIGS. 2A-2D are schematic diagrams showing a memory unit of the memory device of FIG. 1 in various stages of operation in accordance with an embodiment of the present technology.

DETAILED DESCRIPTION

As described in greater detail below, the technology disclosed herein relates to memory devices, systems with memory devices, and related methods for initializing memory devices based, at least in part, on initialization information stored in NAND-based memory media. A person skilled in the relevant art, however, will understand that the technology may have additional embodiments and that the technology may be practiced without several of the details of the embodiments described below with reference to FIGS. 1-4. In the illustrated embodiments below, the memory devices are described in the context of SSDs incorporating NAND-based storage media (e.g., NAND-based flash). Memory devices configured in accordance with other embodiments of the present technology, however, can include other types of suitable storage media in addition to or in lieu of NAND-based storage media, such as magnetic storage media.

Figure 1:
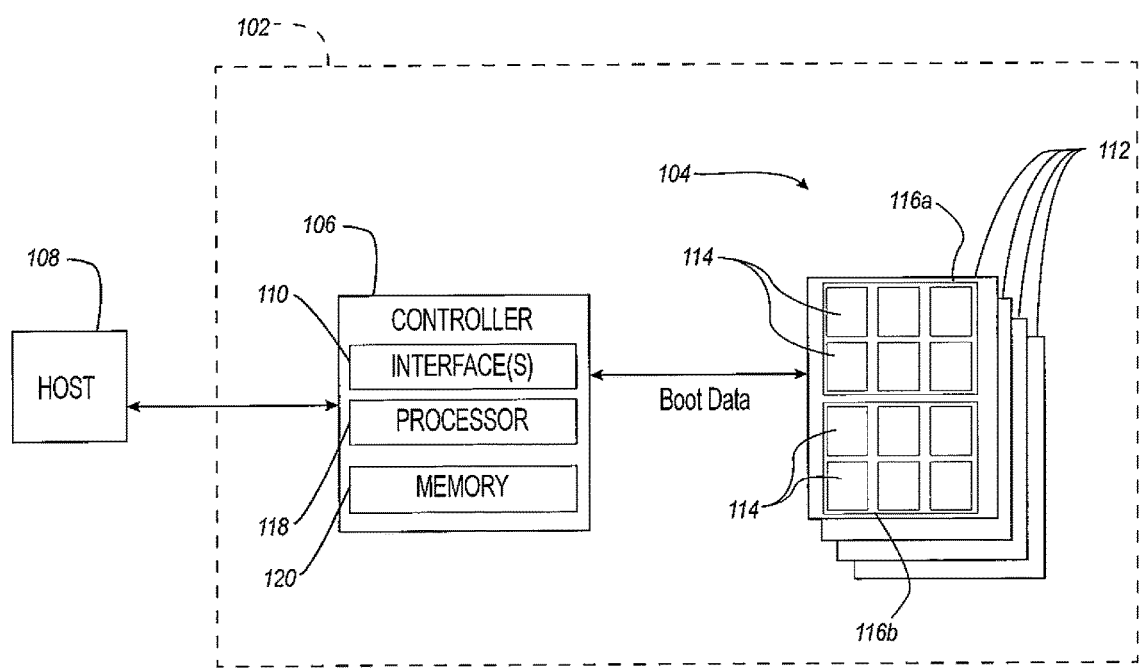
FIG. 1 is a block diagram of a system having a memory device configured in accordance with an embodiment of the present technology

FIG. 1 is a block diagram of a system 100 having a memory device or SSD 102 configured in accordance with an embodiment of the present technology. As shown, the SSD 102 includes a memory media 104 and a memory controller 106 ("controller 106") operably coupling the memory media 104 to a host device 108 (e.g., an upstream central processor (CPU)) via a controller interface 110. The controller interface 110 can be, for example, a serial interface (e.g., a computer system interface (SCSI), a serial AT attachment (ATA) interface, a peripheral component interconnect express (PCIe) interface, etc.), and/or other suitable interface (e.g., a parallel interface). In some embodiments described in greater detail below, the SSD 102 can be configured as a universal flash storage system (UFS) comprising the memory media 104, but omitting other types of memory media, such as random access memory (RAM). For example, in some embodiments, such a system may omit NOR-based memory (e.g., NOR-based flash) and dynamic random access memory (DRAM) to reduce power requirements and/or manufacturing costs.

The memory media 104 includes a plurality of memory units 112 that each include a plurality of memory cells (not shown). The individual memory cells can include a storage element (not shown) configured to store a data state persistently or semi-persistently. In some embodiments, such a storage element can include a floating gate. In the embodiment illustrated in FIG. 1, the memory units 112 are NAND-based memory units 112 composed of memory cells arranged in groups or "memory pages" 114. The memory pages 114, in turn, are grouped into larger groups or "memory blocks" 116 (identified individually as first and second blocks 116a and 116b in FIG. 1). In other embodiments, memory cells can be arranged in different types of groups and/or hierarchies. Further, while a certain number of memory pages, blocks, and units are shown in the illustrated embodiments, the number of pages, blocks, and memory units can vary, and can be larger in scale than shown in the illustrated examples, in other embodiments. For example, in some embodiments, the SSD 102 can include, e.g., eight, ten, or more (e.g., 16, 32, 64, or more) memory units 112. In such embodiments, each memory unit 112 can include, e.g., $2^{11}$ memory blocks 116, with each block 116 including, e.g., $2^{15}$ memory pages 114, and each memory page 114 within a block including, e.g., $2^{15}$ memory cells.

The memory media 104 and/or the individual memory units 112 can also include other circuit components (not shown), such as multiplexers, decoders, buffers, read/write drivers, address registers, data out/data in registers, etc., for accessing and programming (e.g., reading/writing) memory cells in the memory media 104 and/or performing other functions, such as processing information and/or enabling communication with the controller 106. In one embodiment, each of the memory units 112 can be formed from a semiconductor die and arranged with other memory unit dies in a single device package (not shown). In other embodiments, one or more of the memory units can be co-located on a single die and/or distributed across multiple device packages.

The controller 106 can be a microcontroller, special purpose logic circuitry (e.g., a field programmable gate array (FPGA), an application specific integrated circuit (ASIC), etc.), or another suitable processor. The controller 106 includes a processor 118 and an internal memory component 120. The processor 118 is configured to execute instructions stored in the internal memory component 120 to perform various processes, logic flows, and routines for controlling operation of the SSD 102 and managing communications between the SSD 102 and the host device 108. In general, the controller 106 can directly access and program (i.e., read and/or write) the memory pages 114, memory blocks 116, and/or memory units 112 collectively and/or individually. For example, the controller 106 can write data to one or more of these various regions of the memory media 104 in response to a write command received from the host device 108.

One function of the controller 106 is to initialize the SSD 102 for operation. Initialization can include, for example, programming data registers (not shown) with initial values, loading a boot block image, establishing a communication link with the host device 108, verifying credentials, building a mapping table (e.g., flash translation table), etc. Typically, the controller 106 will initialize the SSD 102 when the SSD 102 first starts up (e.g., when the SSD 102 and/or the host device 108 is powered from off to on). In some instances, the controller 106 can initialize the SSD 102 in response to a reset command received from the host device 108. In the embodiment illustrated in FIG. 1, the controller 106 initializes the SSD 102 based, at least in part, on initialization information, such as boot data, read out from the memory media 104. In one embodiment described below, the boot data is stored in one of the memory pages 114 of the memory media 104 in the form of a startup table (not shown). The boot data can include, for example, memory pointers (referencing, e.g., memory addresses), memory mappings, data values, and/or other suitable information for readying device operation.

During operation of the SSD 102, the controller 106 periodically updates the boot data stored in the memory media 104. For example, after a write operation, the controller 106 can update a memory pointer to identify a different region (not shown) of the memory media 104 that is empty or otherwise available for writing. Accordingly, the controller 106 can use the updated memory pointer to locate the available region when it receives a subsequent write command. Additionally or alternately, the controller 106 can add a memory pointer to the boot data when it detects a non-working memory region (not shown) of the memory media 104. Such a non-working memory region can include, for example, a defective region (e.g., a bad block), a region exceeding a max write count, a trimmed region, etc. In some cases, the controller 106 compiles a list of the non-working memory regions as it cycles through the memory media 104 a first time. When the controller 106 cycles through the memory media 104 a second time, it can use this list to avoid the non-working regions. The controller 106 can also update the list of non-working regions as it cycles through the memory media 104.

In at least some embodiments, the controller 106 writes the boot data to the memory media 104 before or during shutdown of the SSD 102 (e.g., before or during a power down of the SSD 102 and/or the host device 108). When the SSD 102 is re-started after the shutdown, the controller 106 can use the boot data to restore the SSD 102 to its previous state before shutdown (known to those skilled in the art as a "quick boot"). For example, the controller 106 can use the boot data to identify memory pages 114 available for writing, non-working memory regions, and/or other state information (e.g., cached data) associated with the SSD 102 before shutdown. In some embodiments, the boot data may only occupy a small fraction (e.g., one memory page 114) of the overall memory capacity of one of the memory blocks 116.

In general, conventional SSDs store boot data in RAM (e.g., NOR and/or DRAM). RAM is favored over NAND-based memory for storing boot data because RAM has an interface that allows the memory controller to select and reprogram memory cells individually (i.e., rather than serially, as in the case of NAND). As a result, the memory controller of a conventional SSD can readily locate and update the boot data in RAM. In general, when updating boot data, the memory controller will typically first erase the boot data stored in RAM and then write the updated information to the same memory location (i.e., memory address) at which the initial information was originally stored. The memory controller can also flag the boot data as invalid when this information becomes stagnant or is no longer reliable.

By contrast, the memory cells in NAND-based memory media cannot be readily reprogrammed like the memory cells in RAM. In particular, reprogramming NAND media typically requires the memory controller to erase an entire block of memory (e.g., one of the memory blocks 116) before it can reprogram any one of the memory pages (e.g., one of the memory pages 114) in the selected memory block. If the memory controller attempts to re-write (e.g., overwrite) a memory page without first erasing the entire block which contains the page, the re-write will produce bit errors in the memory page. In general, these bit errors cannot be readily resolved (e.g., efficiently resolved) using error code correction, such as Bose, Chaudhuri, and Hocquenghem (BCH) code correction. Consequently, when reprogramming NAND-based memory media, the memory controller must wipe out all of the data in a memory block to empty the memory pages before it can reprogram any of the memory pages in that memory block.

SSDs and other memory devices configured in accordance with the various embodiments of the present technology, however, overcome these and other challenges associated with storing boot data in NAND-based and similar memory media. In one such embodiment, the memory media 104 stores the boot data in a first region (e.g., a single memory page 114) of the memory media 104. When the controller 106 seeks to update the boot data, it invalidates the boot data stored in the first region, and stores updated boot data in a second region (e.g., a different memory page 114) of the memory media 104. In some embodiments described below, the controller 106 invalidates the boot data stored in the first region of the memory media 104 by re-writing the first region without first erasing it. Overwriting the first region of the memory media 104 in such a manner can generate bit errors in the first region that indicate that the boot data stored in this region is no longer valid.

FIGS. 2A-2D are isometric, schematic diagrams of an individual memory unit 112 of the SSD 102 of FIG. 1 in various stages of operation in accordance with an embodiment of the present technology. In the illustrated embodiments of FIGS. 2A-2D only a single memory unit 112 is shown for purposes of clarity. In this embodiment and others, however, the other memory units 112 of the memory media 104 (FIG. 1) can include similar states of operation and/or operate in a similar manner as described below.

FIG. 2A shows the memory unit 112 in a first stage of operation, such as a stage before shutdown (e.g., power down) of the SSD 102 (FIG. 1). In the first stage shown in FIG. 2A, the controller 106 (FIG. 1) has written boot data (e.g., memory pointers, write cycle counts, bad block regions, etc.) to a first memory page 214a in the form a startup table 230a. In the example illustrated in FIG. 2A, the startup table 230a includes a memory pointer $P_1$ referencing one or more of the memory pages 114 available for writing. In one embodiment, the controller 106 can store a first memory address $A_1$ associated with the first memory page 214a in the internal memory component 120 (FIG. 1). The controller 106 can use the first memory address $A_1$ to locate the startup table 230a in the memory unit 112 (e.g., upon startup).

FIG. 2B shows the memory unit 112 in a second stage of operation after the first stage of operation of FIG. 2A. In one embodiment, the second stage occurs upon startup of the SSD 102 (FIG. 1). In the second stage shown in FIG. 2B, the controller 106 (FIG. 1) has written data $d_1$ across second memory pages 214b located in the first and second memory blocks 116a and 116b. In one embodiment the controller 106 can write the data $d_1$ in response to a write command received from the host device 108 (FIG. 1). The controller 106 uses the memory pointer $P_1$ to identify the location(s) of the second memory pages 214b before writing the data $d_1$ to these memory pages 214b. In one embodiment, the controller 106 also reserves at least one open memory page 114 in at least one of the memory blocks 116a and 116b.

FIG. 2C shows the memory unit 112 in a third stage of operation after the second stage of operation of FIG. 2B. In the third stage shown in FIG. 2C, the controller 106 (FIG. 1) has invalidated the startup table 230a stored in the first memory page 214a. In particular, the controller 106 invalidates the startup table 230a so that it does not later rely on the now invalid memory pointer $P_1$ when attempting to locate available memory pages for writing. For example, if the controller 106 were to initialize the SSD 102 based on the now invalid memory pointer $P_1$ in the startup table 230a of FIG. 2C, this could lead to the controller 106 overwriting the original data stored in the second memory pages 214b. As discussed above, such overwriting can produce bit errors that typically cannot be readily resolved via error code correction. Accordingly, the original data $d_1$ and/or any new data stored in the second memory pages 214b might be rendered unreadable and/or unreliable if they were to be overwritten as a result of the invalid memory pointer $P_1$.

In various embodiments, the controller 106 invalidates the startup table 230a by overwriting the first memory page 214a with other information (e.g., null data) to produce bit errors in this memory page 214a that can be detected by the controller 106. The controller 106, however, does not overwrite the second memory pages 214b. As a result, the original startup table 230a can be detected as an invalid table based on the bit errors in the first memory page 214a, while the data $d_1$ stored in the second memory pages 214b is not affected. In one embodiment, the controller 106 can produce bit errors in the first memory page 214a by overwriting the memory page 214a with the same startup table 230a originally stored in the first memory page 214a in FIG. 2A.

FIG. 2D shows the memory unit 112 in a fourth stage of operation after the third stage of operation. In the fourth stage shown in FIG. 2D, the controller 106 (FIG. 1) has stored an updated startup table 230b in a third memory page 214c located in the second memory block 116b. The third memory page 214c can be an open page 114 in at least one of the memory blocks 116a and 116b, such as the reserved memory page 114 shown in FIGS. 2B and 2C or another open memory page 114 in, e.g., in another memory block (not shown) of the memory unit 112. The updated startup table 230b can include at least some of the same information as the original startup table 230a. However, the updated startup table 230b includes an updated memory pointer $P_2$ that no longer references the second memory pages 214b. Instead, the updated memory pointer $P_2$ references other memory pages (not shown) available for writing. Further, the controller 106 can store a second memory address $B_1$ associated with the third memory page 214c in the internal memory component 120 (FIG. 1) to identify the location of the updated startup table 230b.

Figure 3:
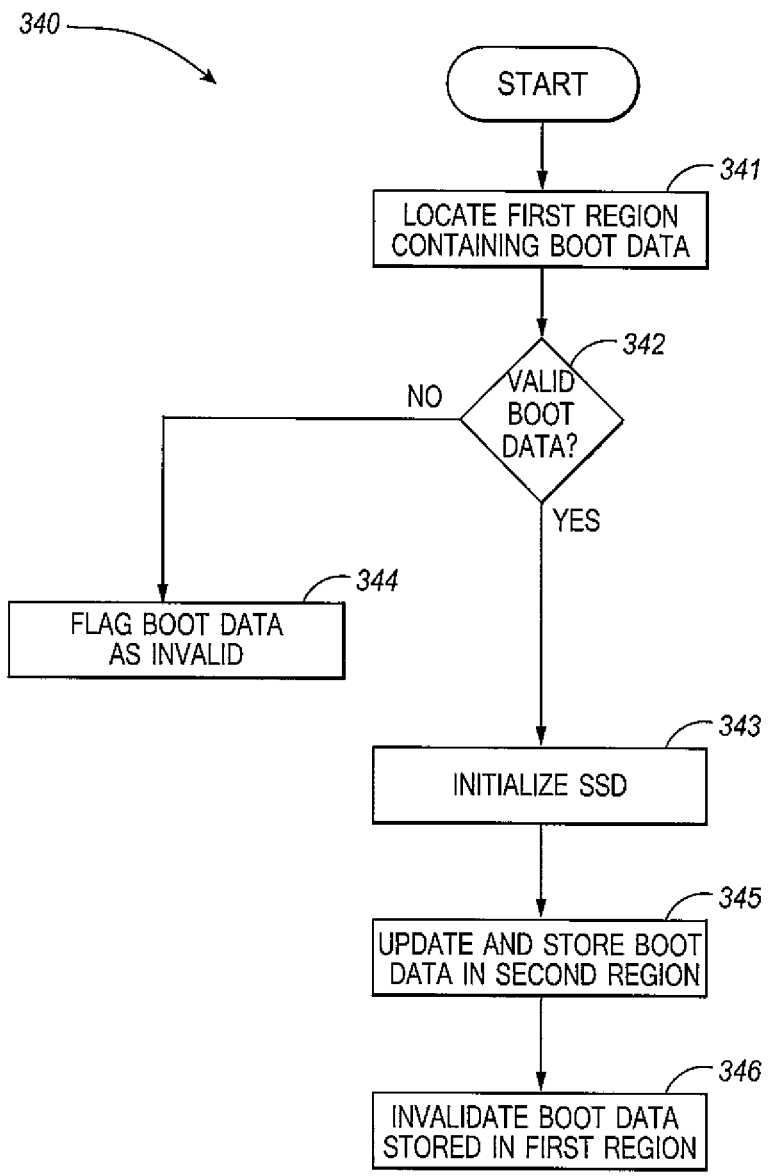
FIG. 3 is a flow diagram illustrating a method for operating a memory device in accordance with an embodiment of the present technology.

FIG. 3 is a flow diagram illustrating a routine 340 for operating a memory device in accordance with an embodiment of the present technology. In one embodiment, the routine 340 can be carried out by the controller 106 (FIG. 1) upon startup of the SSD 102 (FIG. 1), such as to enable a boot up sequence (e.g., a quick boot) using the boot data stored in the memory media 104 (FIG. 1). The routine 340 begins by determining the location of a first region of the memory media 104 that stores the boot data (block 341). For example, in one embodiment, the routine 340 can locate the boot data in the memory media 104 using the first memory address $A_1$ (FIG. 2A) stored in the memory component 120 (FIG. 1).

The routine 340 next determines whether the boot data stored in the first region of the memory media 104 is valid (block 342). In particular, the routine 340 reads out at least a portion of the boot data and checks for bit errors. Typically, NAND memory pages include a relatively small number of memory cells dedicated exclusively to error code correction. These memory cells store information that the controller 106 can use to resolve bit errors during read out operations using, e.g., BCH codes, low-density parity-check (LDPC) codes, or other suitable error code correction algorithms. If the data read out passes error code correction, the routine 340 proceeds to initialize the SSD 102 based on the boot data (block 343). Otherwise, the routine 340 flags the boot data as invalid (block 344). In some embodiments, when the boot data is flagged as being invalid, the routine 340 can load default boot instructions stored in the controller 106. In such cases, the default boot instructions will not include all or any of the information of the boot data stored in the memory media 104. For example, the default boot information may not identify the location of available memory and/or bad blocks, and the controller 106 may be required to cycle through the memory media 104 and re-identify these locations. Accordingly, the default boot instructions will typically not enable a quick boot.

Once the SSD 102 is initialized, the routine 340 proceeds to update the boot data (block 345) and store the updated boot data in a second region of the memory media 104. For example, the routine 340 can update the boot data when it detects the location of a bad memory block in the memory media 104. In addition or alternately, the routine 340 can update the boot data in conjunction with a write operation, a read operation, and/or a number of write and/or read operations. Further, the routine 340 can update the boot data before shutdown (e.g., power down) of the SSD 102.

In one embodiment, the updated boot data is stored in a single memory page 114 (FIG. 1). In other embodiments, the routine 340 can store the updated boot data across multiple memory pages 114 and/or in a dedicated memory block 116 (FIG. 1). The routine 340 can store a memory address (e.g., the memory address $B_1$ of FIG. 2D) in the controller 106 that identifies the location of the updated boot data in the memory media 104. The routine 340 then proceeds to invalidate the first region of the memory media 104 storing the original boot data (block 346). For example, the routine 340 can invalidate the original boot data by overwriting (e.g., by re-writing and/or by writing null data to) the first region of the memory media 104 which stores this boot data, as discussed above.

In one aspect of at least some of the embodiments of the present technology, the routine 340 enables the boot data and/or other initialization information to be stored in a NAND-based memory media rather than RAM. Accordingly, SSDs and other memory devices configured in accordance with these and other embodiments can be manufactured without RAM (e.g., NOR memory), or only a limited amount of RAM (e.g., with only a RAM-based internal component 120 (FIG. 1). As a result, such SSDs and other memory devices can have lower power requirements and/or manufacturing costs.

Figure 4:
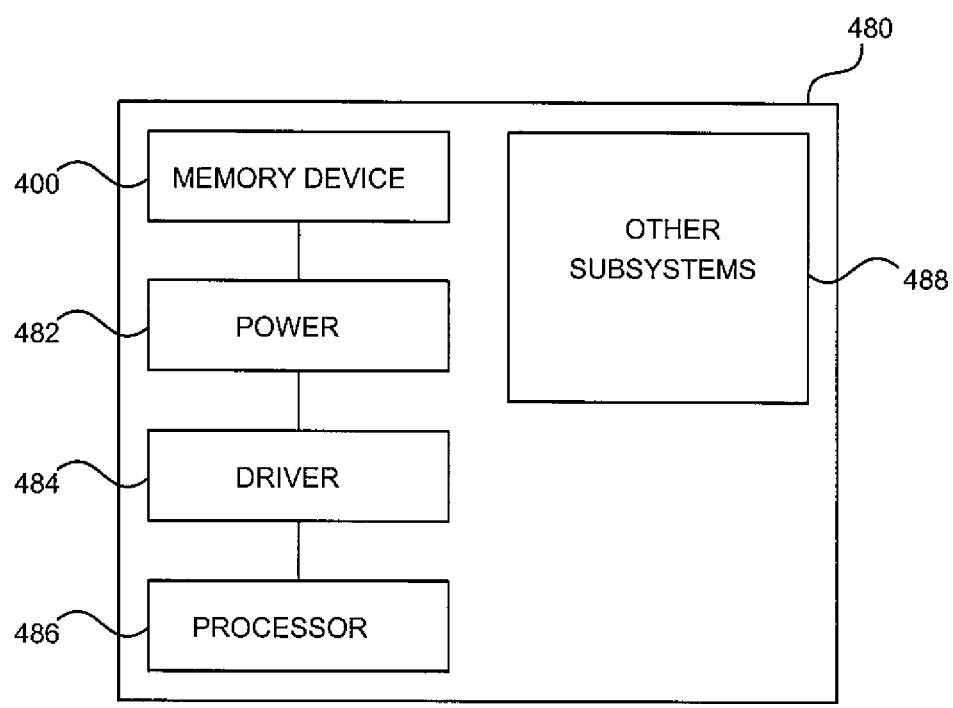
FIG. 4 is a schematic view of a system that includes a memory device in accordance with embodiments of the present technology.

FIG. 4 is a schematic view of a system that includes a memory device in accordance with embodiments of the present technology. Any one of the foregoing memory devices described above with reference to FIGS. 1-3 can be incorporated into any of a myriad of larger and/or more complex systems, a representative example of which is system 480 shown schematically in FIG. 4. The system 480 can include a memory 400, a power source 482, a driver 484, a processor 486, and/or other subsystems or components 488. The memory device 400 can include features generally similar to those of the memory device described above with reference to FIGS. 1-3, and can therefore include various features for storing and updating boot data in NAND-based and similar memory media. The resulting system 480 can perform any of a wide variety of functions, such as memory storage, data processing, and/or other suitable functions. Accordingly, representative systems 480 can include, without limitation, hand-held devices (e.g., mobile phones, tablets, digital readers, and digital audio players), computers, vehicles, appliances and other products. Components of the system 480 may be housed in a single unit or distributed over multiple, interconnected units (e.g., through a communications network). The components of the system 480 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A memory device, comprising:
   a memory media having a region that stores initialization information; and
   a controller operably coupled to the memory media, wherein the controller is configured to—
      determine whether the initialization information stored at the region of the memory media is valid,
      initialize the memory device based at least in part on the initialization information when valid, and
      invalidate the initialization information stored at the region of the memory media by writing to the region of the memory media without first erasing the region of the memory media.

2. The memory device of claim 1 wherein:
   the region of the memory media is a NAND memory page located within a NAND memory block; and
   writing to the region of the memory media includes writing to the NAND memory page without first erasing the NAND memory block.

3. The memory device of claim 2 wherein the controller is further configured to:
   write the initialization information to the NAND memory page before shutdown of the memory device; and
   read the initialization information from the NAND memory page upon startup of the memory device after the shutdown.

4. The memory device of claim 1 wherein:
   the region of the memory media is a first region; and
   the controller is further configured to—
      update the initialization information, and
      store the updated initialization information in a second region of the memory media.

5. The memory device of claim 4 wherein the memory media is a NAND-based memory media.

6. The memory device of claim 4 wherein:
   the region of the memory media is a first region;
   the updated initialization information includes a memory pointer; and
   the controller is further configured to identify a second region of the memory media available for writing based on the memory pointer.

7. The memory device of claim 1 wherein the controller is further configured to:
   read out data from the region of the memory media;
   perform an error code correction routine on at least a portion of the data read out from the region of the memory media; and
   determine whether the initialization information is valid based on a result of the error code correction.

8. The memory device of claim 1 wherein the memory media does not comprise random access memory.

9. The memory device of claim 1 wherein writing to the region of the memory media includes re-writing the same initialization information to the region of the memory media.

* * * * *